United States Patent
Weber et al.

(10) Patent No.: US 10,773,494 B2
(45) Date of Patent: *Sep. 15, 2020

(54) TECHNIQUES FOR MARKING A SUBSTRATE USING A PHYSICAL VAPOR DEPOSITION MATERIAL

(71) Applicant: Apple Inc., Cupertino, CA (US)

(72) Inventors: Douglas Weber, Arcadia, CA (US); Christopher Prest, San Francisco, CA (US); David Pakula, San Francisco, CA (US); Stephen Paul Zadesky, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 354 days.

This patent is subject to a terminal disclaimer.

(21) Appl. No.: 15/812,058

(22) Filed: Nov. 14, 2017

(65) Prior Publication Data
US 2018/0072021 A1 Mar. 15, 2018

Related U.S. Application Data

(60) Continuation of application No. 14/161,493, filed on Jan. 22, 2014, now Pat. No. 9,849,650, which is a
(Continued)

(51) Int. Cl.
*B32B 15/04* (2006.01)
*C23C 14/02* (2006.01)
(Continued)

(52) U.S. Cl.
CPC ............. *B32B 15/04* (2013.01); *B05D 5/06* (2013.01); *C03C 17/3411* (2013.01);
(Continued)

(58) Field of Classification Search
None
See application file for complete search history.

(56) References Cited

U.S. PATENT DOCUMENTS

| 2,647,079 A | 7/1953 | Burnham |
| 3,080,270 A | 3/1963 | Fritz |

(Continued)

FOREIGN PATENT DOCUMENTS

| CN | 1362125 | 8/2002 |
| CN | 1306526 C | 3/2007 |

(Continued)

OTHER PUBLICATIONS http://dba.med.sc.edu/price/irf/Adobe_tg_models/cielab.html,published 2000.

(Continued)

*Primary Examiner* — David Sample
(74) *Attorney, Agent, or Firm* — David K. Cole (57) ABSTRACT

Techniques, processes and structures are disclosed for providing markings on products, such as electronic devices. For example, the markings can be formed using physical vapor deposition (PVD) processes to deposit a layer of material. The markings or labels may be textual and/or graphic. The markings are deposited on a compliant layer that is disposed on a surface to be marked. The compliant layer is arranged to isolate the surface to be marked from the layer of material deposited using the PVD process.

20 Claims, 7 Drawing Sheets

Related U.S. Application Data division of application No. 12/868,602, filed on Aug. 25, 2010, now Pat. No. 8,663,806.

(60) Provisional application No. 61/236,847, filed on Aug. 25, 2009, provisional application No. 61/250,369, filed on Oct. 9, 2009.

(51) Int. Cl.

| | | |
|---|---|---|
| *C23C 14/04* | (2006.01) | |
| *B05D 5/06* | (2006.01) | |
| *C03C 17/36* | (2006.01) | |
| *C03C 17/38* | (2006.01) | |
| *C03C 17/34* | (2006.01) | |
| *B05D 7/00* | (2006.01) | |

(52) U.S. Cl.
CPC ...... *C03C 17/3607* (2013.01); *C03C 17/3636* (2013.01); *C03C 17/3649* (2013.01); *C03C 17/3684* (2013.01); *C03C 17/38* (2013.01); *C23C 14/024* (2013.01); *C23C 14/042* (2013.01); *B05D 5/068* (2013.01); *B05D 7/52* (2013.01); *Y10T 428/265* (2015.01); *Y10T 428/31645* (2015.04); *Y10T 428/31678* (2015.04); *Y10T 428/31681* (2015.04); *Y10T 428/31692* (2015.04); *Y10T 428/31855* (2015.04)

(56) References Cited

U.S. PATENT DOCUMENTS

| | | |
|---|---|---|
| 3,526,694 A | 9/1970 | Lemelson |
| 3,615,432 A | 10/1971 | Jenkins et al. |
| 3,645,777 A | 2/1972 | Sierad |
| RE28,225 E | 11/1974 | Heseltine et al. |
| 4,247,600 A | 1/1981 | Adachi |
| 4,269,947 A | 5/1981 | Inata et al. |
| 4,282,597 A | 8/1981 | Yenawine et al. |
| 4,531,705 A | 7/1985 | Nakagawa et al. |
| 4,547,649 A | 10/1985 | Butt et al. |
| 4,564,001 A | 1/1986 | Maeda |
| 4,931,366 A | 6/1990 | Mullaney |
| 4,993,148 A | 2/1991 | Adachi et al. |
| 5,202,013 A | 4/1993 | Chamberlain et al. |
| 5,417,905 A | 5/1995 | Lemaire et al. |
| 5,744,270 A | 4/1998 | Pearlman et al. |
| 5,837,086 A | 11/1998 | Leeb et al. |
| 5,872,699 A | 2/1999 | Nishii et al. |
| 5,925,847 A | 7/1999 | Rademacher et al. |
| 6,007,929 A | 12/1999 | Robertson et al. |
| 6,037,041 A * | 3/2000 | Van Kooyk ............ C03C 8/14 428/195.1 |
| 6,101,372 A | 8/2000 | Kubo |
| 6,169,266 B1 | 1/2001 | Hughes |
| 6,331,239 B1 | 12/2001 | Shirota et al. |
| 6,480,397 B1 | 11/2002 | Hsu et al. |
| 6,540,867 B1 | 4/2003 | Cochran |
| 6,574,096 B1 | 6/2003 | Difonzo et al. |
| 6,590,183 B1 | 7/2003 | Yeo |
| 6,633,019 B1 | 10/2003 | Gray |
| 6,746,724 B1 | 6/2004 | Robertson et al. |
| 6,802,952 B2 | 10/2004 | Hsu et al. |
| 6,966,133 B2 | 11/2005 | Krings et al. |
| 6,996,425 B2 | 2/2006 | Watanabe |
| 7,065,820 B2 | 6/2006 | Meschter |
| 7,134,198 B2 | 11/2006 | Nakatani et al. |
| 7,157,987 B2 | 1/2007 | Brunker et al. |
| 7,181,172 B2 | 2/2007 | Sullivan et al. |
| 7,225,529 B2 | 6/2007 | Wang |
| 7,459,373 B2 | 12/2008 | Yoo |
| 7,622,183 B2 | 11/2009 | Shirai et al. |
| 7,636,974 B2 | 12/2009 | Meschter et al. |
| 7,691,189 B2 | 4/2010 | En et al. |
| 8,192,815 B2 | 6/2012 | Weber et al. |
| 8,367,304 B2 | 2/2013 | Heley et al. |
| 8,379,678 B2 | 2/2013 | Zhang et al. |
| 8,379,679 B2 | 2/2013 | Zhang et al. |
| 8,663,806 B2 | 3/2014 | Weber et al. |
| 8,761,216 B2 | 6/2014 | Zhang et al. |
| 8,809,733 B2 | 8/2014 | Scott et al. |
| 8,842,351 B2 | 9/2014 | Lawrence et al. |
| 8,879,266 B2 | 11/2014 | Jarvis et al. |
| 8,893,975 B2 | 11/2014 | Sanford et al. |
| 8,941,550 B2 | 1/2015 | Whitmore et al. |
| 8,993,921 B2 | 3/2015 | Browning et al. |
| 9,034,166 B2 | 5/2015 | Tatebe et al. |
| 9,089,932 B2 | 7/2015 | Lim |
| 9,132,510 B2 | 9/2015 | Nashner et al. |
| 9,133,559 B2 | 9/2015 | Silverman et al. |
| 9,138,826 B2 | 9/2015 | Harrison |
| 9,173,336 B2 | 10/2015 | Bhatia et al. |
| 9,185,835 B2 | 11/2015 | Heley et al. |
| 9,314,871 B2 | 4/2016 | Nashner et al. |
| 10,556,823 B2 * | 2/2020 | Rogers ............... C03C 17/36 |
| 2001/0040001 A1 | 11/2001 | Toyooka |
| 2002/0058737 A1 | 5/2002 | Nishiwaki et al. |
| 2002/0097440 A1 | 7/2002 | Paricio |
| 2002/0109134 A1 | 8/2002 | Iwasaki et al. |
| 2002/0130441 A1 | 9/2002 | Robinson et al. |
| 2002/0160145 A1 | 10/2002 | Bauhoff |
| 2003/0006217 A1 | 1/2003 | Dance |
| 2003/0225189 A1 | 12/2003 | Fuller |
| 2005/0023022 A1 | 2/2005 | Kriege et al. |
| 2005/0034301 A1 | 2/2005 | Wang |
| 2005/0115840 A1 | 6/2005 | Dolan |
| 2005/0158576 A1 | 7/2005 | Groll |
| 2005/0263418 A1 | 12/2005 | Bastus Cortes |
| 2006/0007524 A1 | 1/2006 | Tam |
| 2006/0055084 A1 | 3/2006 | Yamaguchi et al. |
| 2006/0066771 A1 | 3/2006 | Hayano et al. |
| 2006/0105542 A1 | 5/2006 | Yoo |
| 2006/0225918 A1 | 10/2006 | Chinda et al. |
| 2006/0269729 A1 * | 11/2006 | Gan ............... B32B 15/00 428/209 |
| 2007/0018817 A1 | 1/2007 | Marmaropoulos et al. |
| 2007/0045893 A1 | 3/2007 | Asthana et al. |
| 2007/0053504 A1 | 3/2007 | Sato et al. |
| 2007/0262062 A1 | 11/2007 | Guth |
| 2007/0275263 A1 | 11/2007 | Groll |
| 2008/0004088 A1 | 1/2008 | Lundell et al. |
| 2008/0122137 A1 | 5/2008 | Hamaoka |
| 2008/0152859 A1 | 6/2008 | Nagal |
| 2008/0241478 A1 | 10/2008 | Costin et al. |
| 2008/0274375 A1 | 11/2008 | Ng et al. |
| 2008/0295263 A1 | 12/2008 | Meschter et al. |
| 2008/0299408 A1 | 12/2008 | Guo et al. |
| 2008/0311369 A1 | 12/2008 | Yokoyama et al. |
| 2009/0017242 A1 | 1/2009 | Weber et al. |
| 2009/0104949 A1 | 4/2009 | Sato et al. |
| 2009/0136723 A1 | 5/2009 | Zhao et al. |
| 2009/0190290 A1 | 7/2009 | Lynch et al. |
| 2009/0194444 A1 | 8/2009 | Jones |
| 2009/0197048 A1 | 8/2009 | Amin et al. |
| 2009/0236143 A1 | 9/2009 | Nakamura |
| 2009/0260871 A1 | 10/2009 | Weber et al. |
| 2009/0305168 A1 | 12/2009 | Heley et al. |
| 2010/0014232 A1 * | 1/2010 | Nishimura ........ B29C 45/14073 361/679.3 |
| 2010/0065313 A1 | 3/2010 | Takeuchi et al. |
| 2010/0089637 A1 | 4/2010 | Lin et al. |
| 2010/0159183 A1 * | 6/2010 | Nishimura ........ B29C 45/14639 428/77 |
| 2010/0159273 A1 | 6/2010 | Filson et al. |
| 2010/0183869 A1 | 7/2010 | Lin et al. |
| 2010/0209721 A1 | 8/2010 | Irikura et al. |
| 2010/0209731 A1 | 8/2010 | Hamano |
| 2010/0294426 A1 | 11/2010 | Nashner |
| 2010/0300909 A1 | 12/2010 | Hung |
| 2011/0008618 A1 | 1/2011 | Weedlun |
| 2011/0048755 A1 | 3/2011 | Su et al. |
| 2011/0193928 A1 | 8/2011 | Zhang et al. |
| 2011/0193929 A1 | 8/2011 | Zhang et al. |

(56) References Cited

U.S. PATENT DOCUMENTS

| | | |
|---|---|---|
| 2011/0194574 A1 | 8/2011 | Zhang et al. |
| 2011/0253411 A1 | 10/2011 | Hum et al. |
| 2011/0315667 A1 | 12/2011 | Reichenback et al. |
| 2012/0043306 A1 | 2/2012 | Howerton et al. |
| 2012/0100348 A1 | 4/2012 | Brokhyser et al. |
| 2012/0248001 A1 | 10/2012 | Nashner |
| 2012/0275130 A1 | 11/2012 | Hsu et al. |
| 2013/0129986 A1 | 5/2013 | Heley et al. |
| 2014/0000987 A1 | 1/2014 | Peacock et al. |
| 2014/0134429 A1 | 5/2014 | Weber et al. |
| 2014/0186654 A1 | 7/2014 | Zhang |
| 2014/0363608 A1 | 12/2014 | Russell-Clarke et al. |
| 2014/0367369 A1 | 12/2014 | Nashner et al. |
| 2014/0370325 A1 | 12/2014 | Nashner et al. |
| 2015/0093563 A1 | 4/2015 | Runge et al. |
| 2015/0132541 A1 | 5/2015 | McDonald et al. |
| 2015/0176146 A1 | 6/2015 | Browning et al. |

FOREIGN PATENT DOCUMENTS

| | | |
|---|---|---|
| CN | 201044438 Y | 2/2008 |
| CN | 101204866 | 6/2008 |
| CN | 102173242 A | 9/2011 |
| DE | 19523112 | 6/1996 |
| DE | 102005048870 | 4/2007 |
| EP | 0031463 | 7/1981 |
| EP | 0114565 | 8/1984 |
| EP | 121150 A1 | 10/1984 |
| EP | 0234121 | 9/1987 |
| EP | 0633585 | 1/1995 |
| EP | 0997958 | 5/2000 |
| EP | 2399740 | 12/2011 |
| EP | 2488369 B1 | 3/2014 |
| GB | 788329 | 12/1957 |
| JP | 357149491 A | 9/1982 |
| JP | 03013331 | 1/1991 |
| JP | 03138131 | 6/1991 |
| JP | 3203694 A | 9/1991 |
| JP | AH06212451 | 8/1994 |
| JP | 06126192 | 10/1994 |
| JP | 06320104 | 11/1994 |
| JP | 7-204871 A | 8/1995 |
| JP | 2000000167 | 1/2000 |
| JP | 2002370457 | 12/2002 |
| JP | 2003055794 | 2/2003 |
| JP | 200522924 | 1/2005 |
| JP | 2006138002 | 6/2006 |
| JP | 2008087409 | 4/2008 |
| WO | 9853451 | 11/1998 |
| WO | WO0077883 | 12/2000 |
| WO | 0115916 | 3/2001 |
| WO | 0134408 | 5/2001 |
| WO | 2006124279 | 11/2006 |
| WO | 2007088233 | 8/2007 |
| WO | WO2008035736 A1 | 3/2008 |
| WO | 2008092949 | 8/2008 |
| WO | WO-2008149789 A1 * | 12/2008 ....... B29C 45/14639 |
| WO | 2009051218 | 4/2009 |
| WO | WO2009151402 A1 | 12/2009 |
| WO | 2010095747 | 8/2010 |
| WO | WO2010111798 A1 | 10/2010 |
| WO | WO2010135415 | 11/2010 |
| WO | 2011047325 A1 | 4/2011 |

OTHER PUBLICATIONS

Lewis, "Hawley's Condensed Chemical Dictionary", 12th edition, Van Nostrand Reinhold company, New York, 1993. excerpt p. 1075.

Webster's Nine to New Collegiate Dictionary; Merriam-Webster Inc., 1990, excerpt p. 412.

Hajdu, "Chapter 7", 1990, William Andrew Publishing from www.knovel.com, pp. 193-2016.

"DP2UV Basick System 2 W", ROBA Technology + Services GmbH, Aug. 2008, 2 pgs.

Annerfors et al., "Nano Molding Technology on Cosmetic Aluminum Parts in Mobile Phones", Division of Production and Materials Engineering, LTH, 2007.

"Thermal Shock Resistant Conformal Coating", Product Data Sheet, Dymax Corporation, Jul. 9, 2007, pp. 1-2.

"Marking Lasers: Marking without Limitations", Trumpf Inc., Sep. 10, 2007, pp. 1-36.

"UV-Curing sheet Adhesives", ThreeBond Technical News, Issued Jul. 1, 2009, 8 pages, Chang, "Lasers Make Other Metals Look Like Gold", New York Times, nytimes.com, 2 pgs., Jan. 31, 2008.

"Database EPI" Week 201107 thomas Scientific, London, GB; AN 2010-Q46184, Nov. 17, 2010, 1 pg.

Office Action for U.S. Appl. No. 12/868,602, dated Jan. 3, 2013.

Final Office Action for U.S. Appl. No. 12/868,6002, dated Aug. 14, 2013.

Notice of Allowance for U.S. Appl. No. 12/868,602, dated Oct. 17, 2013.

* cited by examiner

TECHNIQUES FOR MARKING A SUBSTRATE USING A PHYSICAL VAPOR DEPOSITION MATERIAL

CROSS-REFERENCE TO RELATED APPLICATIONS

This application is a continuation of patent application Ser. No. 14/161,493, filed Jan. 22, 2014, which is a division of patent application Ser. No. 12/868,602, filed Aug. 25, 2010, now U.S. Pat. No. 8,663,806, which claims the benefit of provisional patent application No. 61/236,847, filed Aug. 25, 2009 and provisional patent application No. 61/250,369, filed Oct. 9, 2009, which are hereby incorporated by reference herein in their entireties. This application claims the benefit of and claims priority to patent application Ser. No. 14/161,493, filed Jan. 22, 2014, patent application Ser. No. 12/868,602, filed Aug. 25, 2010, now U.S. Pat. No. 8,663,806, provisional patent application No. 61/236,847, filed Aug. 25, 2009, and provisional patent application No. 61/250,369, filed Oct. 9, 2009.

BACKGROUND OF THE INVENTION

Field of Invention

The invention relates generally to providing markings on products and, more particularly, to providing markings on substrates using a physical vapor deposition (PVD) material.

Description of the Related Art

Consumer products, e.g., electronic devices, have been marked for many years. It is relatively common for electronic devices to be marked or labeled, for example, with logos, artwork, and information such as a serial number or a model number. Often, substrates associated with an electronic device may be marked.

Substrates may be marked using a physical vapor deposition (PVD) process. Using a PVD process, a PVD coating formed from a material such as metal may be deposited directly onto a surface of a substrate to mark the surface of the substrate. The PVD coating is deposited as a layer, e.g., film, that is bonded to the surface of the substrate.

SUMMARY

The invention pertains generally to techniques or processes for providing markings on products using physical vapor deposition (PVD) processes. By providing a compliant intermediate layer between a substrate and a layer of PVD material which forms a marking, stresses on the substrate caused by a PVD process may be substantially reduced.

According to one aspect, a substrate structure can, for example, include a substrate, a compliant layer, and a layer of material deposited on the compliant layer using a PVD process. The compliant layer can be deposited on a first surface of the substrate, and can be positioned between the substrate and the layer of material deposited using the PVD process. The compliant layer can be arranged to isolate the substrate from the layer of material deposited using the PVD process. In one embodiment, the substrate is a glass substrate, and the compliant layer is a silicon dioxide layer.

In accordance with another aspect, a portable electronic device can, for example, include a housing for the portable electronic device, with the housing including at least a surface to be marked. A buffer layer can be deposited on the surface to be marked. In addition, to provide one or more markings to the surface to be marked, a layer of material deposited can be deposited on the buffer layer such that the buffer layer is positioned between the substrate and the layer of material deposited.

In accordance with another aspect, a method for forming a substrate structure can, for example, include obtaining a substrate which has at least a first surface, identifying at least one location to be marked using a physical vapor deposition PVD material, and depositing an intermediate layer on the substrate at the at least one location. Finally, the method can include depositing a layer of PVD material over the intermediate layer such that the intermediate layer is sandwiched between the substrate and the layer of PVD material. The intermediate layer can be arranged to isolate the first surface from the layer of PVD material.

In accordance with still another aspect, a method for forming a housing for an electronic device can, for example, include obtaining a substrate having at least a first surface, identifying at least one location to be marked using a deposition, depositing an intermediate layer on the substrate at the at least one location, and depositing a layer of material over the intermediate layer such that the intermediate layer is provided between the substrate and the layer of material.

In accordance with yet still another aspect, a method for forming a housing for an electronic device can, for example, include obtaining a substrate having at least a first surface, identifying at least one location to be marked using a deposition, depositing an intermediate layer on the substrate at the at least one location, and depositing a layer of material over the intermediate layer such that the intermediate layer is provided between the substrate and the layer of material.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

A product, e.g., electronic device, includes a substrate that can be marked. The substrate may be marked using a physical vapor deposition (PVD) process.

Using a PVD process, a PVD coating formed from a material, such as metal, may be deposited directly onto a surface of a substrate to mark the surface of the substrate. The PVD coating is deposited as a layer, e.g., film, that is bonded to the surface of the substrate. However, as the thickness of a layer of PVD coating that is bonded directly onto a surface of a substrate, residual stresses increase within the layer of PVD coating. Such residual stresses may cause the shape of the layer to change, thus effectively altering the marking. These residual stresses in a layer of PVD coating may apply contraction or expansion at an interface between the layer of PVD coating and a surface of a substrate. When the substrate is a relatively brittle, the residual stresses may cause the substrate to crack in the vicinity of the PVD coating. That is, local tensile loading may be created on the surface of the substrate, thereby compromising the resistance of the substrate to fracture. For example, when a layer of PVD coating is bonded to one surface of a glass substrate such that a marking is formed, and a force is applied to an opposite surface of the glass substrate substantially over the marking, residual stresses in the layer PVD coating typically can cause the glass substrate to crack in a location over the marking. In general, as the thickness of the layer of PVD coating increases, the resistance to the glass substrate to cracking decreases. When a substrate cracks, the integrity of a device which includes the substrate may be compromised. Thus, there is a need for improved techniques for enabling PVD coating to be used to create markings on surfaces of substrates.

The invention pertains generally to techniques or processes for providing markings on products. For example, the markings can be formed using physical vapor deposition (PVD) processes. The markings (e.g., labeling) may be textual and/or graphic. The markings may be used to provide a product (e.g., a product's housing) with certain information. The marking may, for example, be use to label the product with various information. When a marking includes text, the text may provide information concerning the product (e.g., electronic device). For example, the text may include one or more of: name of product, trademark or copyright information, design location, assembly location, model number, serial number, license number, agency approvals, standards compliance, electronic codes, memory capacity of device, and the like. When a marking includes a graphic, the graphic may pertain to a logo, a certification mark, standards mark, or an approval mark that is often associated with the product. The marking may be used for advertisements to be provided on products. The markings may also be used for customization (e.g., user customization) of a housing of a product.

A substrate associated with a product may be marked using a material deposited using a PVD process. When a PVD coating is deposited directly on a substrate, residual stresses may be formed in the layer of PVD coating, thereby decreasing the resistance of the substrate to fracture. To reduce the likelihood of premature fracture in the substrate, e.g., to substantially prevent significant reduction to a substrate's resistance to fracture, a complaint intermediate layer (or buffer layer) may be disposed between the surface of the substrate and a layer of PVD coating (or a thin film of PVD material). Such a complaint intermediate layer may effectively reduce stresses on the substrate that may be caused by residual stresses in the layer of PVD coating. In general, the compliant intermediate layer can act as a barrier and thus can isolate the substrate from the layer of PVD coating.

In one embodiment, a compliant intermediate layer used in a substrate structure may be formed from substantially any material that is relatively compliant, such that stress from a layer of PVD coating is not imparted to a substrate. Materials used to form an intermediate layer may include, but are not limited to including, silicon dioxide ($SiO_2$), silicon nitride ($Si_3N_4$), titanium dioxide ($TiO_2$), fluorinated anti-smudge coatings, paint, clearcoat, adhesives, and ink. An intermediate layer may also be formed from any suitable combination of these materials. With respect to adhesives, suitable adhesives include a liquefiable optical adhesive, such as a Polyvinyl Acetate (PVA) adhesive. A liquefiable optical adhesive can provide excellent transparency as well as conformity to surface geometry. One particular example of a suitable adhesive is ThreeBond TB1630 adhesive from Three Bond Co., Ltd., Toyko, Japan.

Figure 1A:
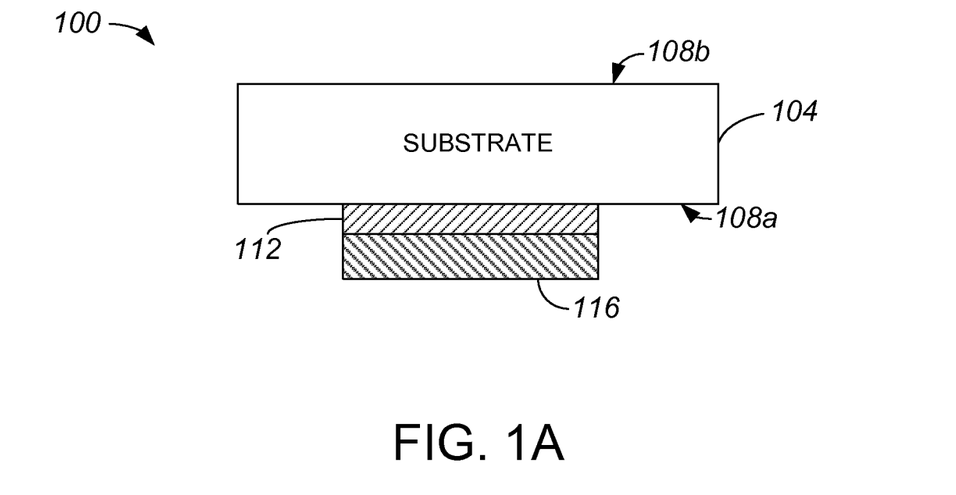
FIG. 1A is a diagrammatic side-view cross-sectional representation of a substrate structure that includes an intermediate or buffer layer between a substrate and a layer of physical vapor deposition (PVD) coating or thin film in accordance with a first embodiment.

Referring initially to FIG. 1A, a substrate structure that includes an intermediate (or buffer layer) essentially sandwiched between a substrate and a layer of PVD coating or thin film will be described in accordance with a first embodiment. A substrate structure 100 includes a substrate 104 with surfaces 108a, 108b which may be on substantially opposite sides of substrate 104. In one embodiment, substrate 104 may be a glass substrate intended for use in a portable electronic device (e.g., a portable computing device or a mobile telephone device). When substrate 104 is a glass substrate intended for use in a device, surface 108a may be arranged to be in an interior of the device and surface 108b may be a user interface surface, e.g., a surface that the user is intended to touch. It should be appreciated that while substrate 104 may be a glass substrate, substrate 104 may also be formed from other materials including, but not limited to including, sapphire, metal, ceramic, and plastic.

An intermediate layer 112 may be deposited, or otherwise substantially bonded, to surface 108a of substrate 104. The intermediate layer 112 can also be referred to as a barrier layer, a buffer layer or a compliant layer. A layer of PVD material 116 may be deposited on intermediate layer 112. Layer of PVD material 116, or a layer of PVD coating, may be formed from any suitable metal, as for example chromium or aluminum. In general, intermediate layer 112 is arranged to substantially isolate substrate 104 from layer of PVD material 116.

Figure 1B:
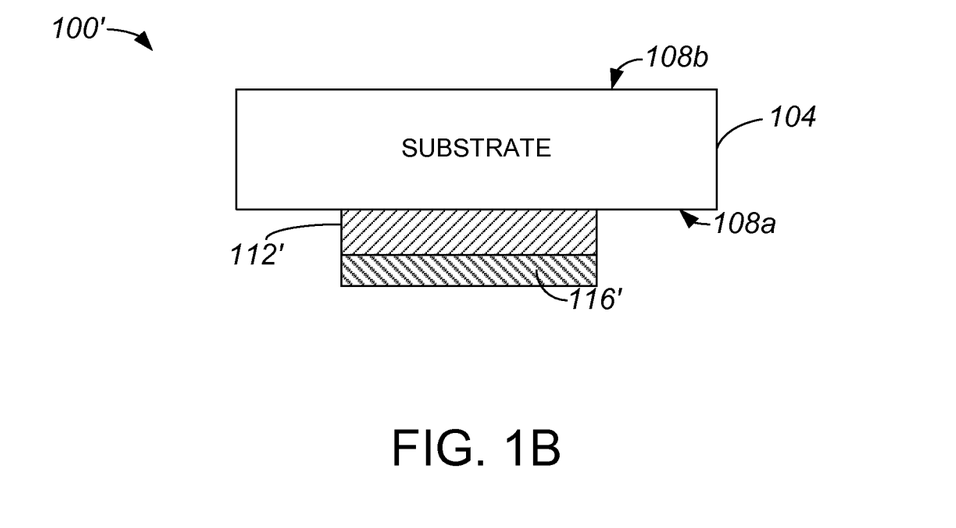
FIG. 1B is a diagrammatic side-view cross-sectional representation of a substrate structure that includes an intermediate or buffer layer between a substrate and a layer of PVD coating or thin film in accordance with a second embodiment.

The overall thicknesses of layer of PVD material 116 and intermediate layer 112 may vary. As shown in FIG. 1A, within substrate structure 100, layer of PVD material 116 may have a thickness that is greater than or approximately equal to a thickness of intermediate layer 112. Alternatively, as shown in FIG. 1B, within a substrate structure 100', a layer of PVD material 116' may have a thickness that is less than or approximately equal to a thickness of an intermediate layer 112'.

In general, layer of PVD material 116 may have a thickness of between approximately 25 nanometers (nm) and approximately 200 nm, as for example approximately 100 nm. The thickness of an intermediate layer may vary widely, as indicated in FIGS. 1A and 1B. Some intermediate layers, e.g., intermediate layer 112 of FIG. 1A, may be relatively thin relative to layer of PVD material 116. Other intermediate layers, e.g., intermediate layer 112' of FIG. 1B, may be relatively thick relative to layer of PVD material 116'. The thickness of intermediate layer may be dependent, at least in part, upon the material from which the intermediate layer is formed and the characteristics of the material. For example, if an intermediate layer is formed from materials such as $SiO_2$, $Si_3N_4$, TiO2, or a fluorinated anti-smudge coating, the intermediate layer may have a thickness of between approximately 50 nm and approximately 500 nm. When an intermediate layer is formed from a material such paint, clearcoat, adhesive or ink, the thickness of the intermediate layer may be between approximately one (1) micrometer (μm) and approximately ten (10) μm.

As mentioned above, a substrate structure which includes an intermediate or buffer layer between a substrate and a layer of PVD coating may be included in a device such that the layer of PVD coating is located substantially inside the device. The device may be a portable electronic device such as a personal digital assistant, a digital media player, a game player, a handheld communications device (e.g., mobile phone), or any suitable computing device.

Figure 2A:
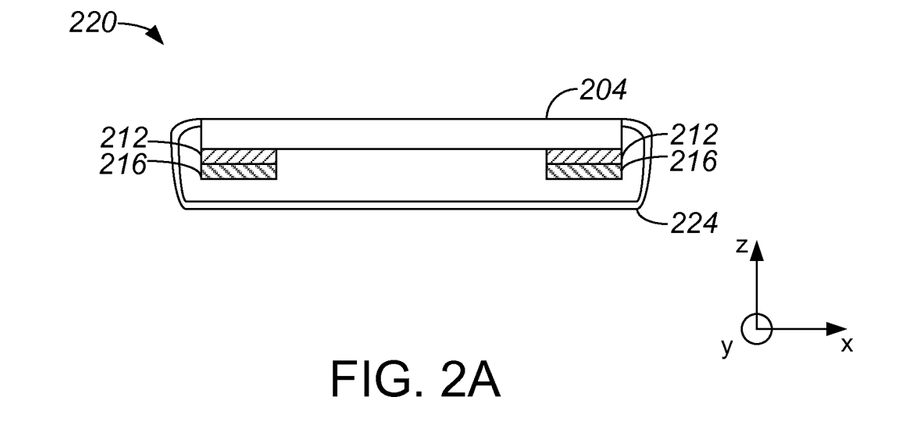
FIG. 2A is a diagrammatic side-view cross-sectional representation of a device in which substrate structure that includes an intermediate or buffer layer between a substrate and a PVD coating is incorporated in accordance with an embodiment.
Figure 2B:
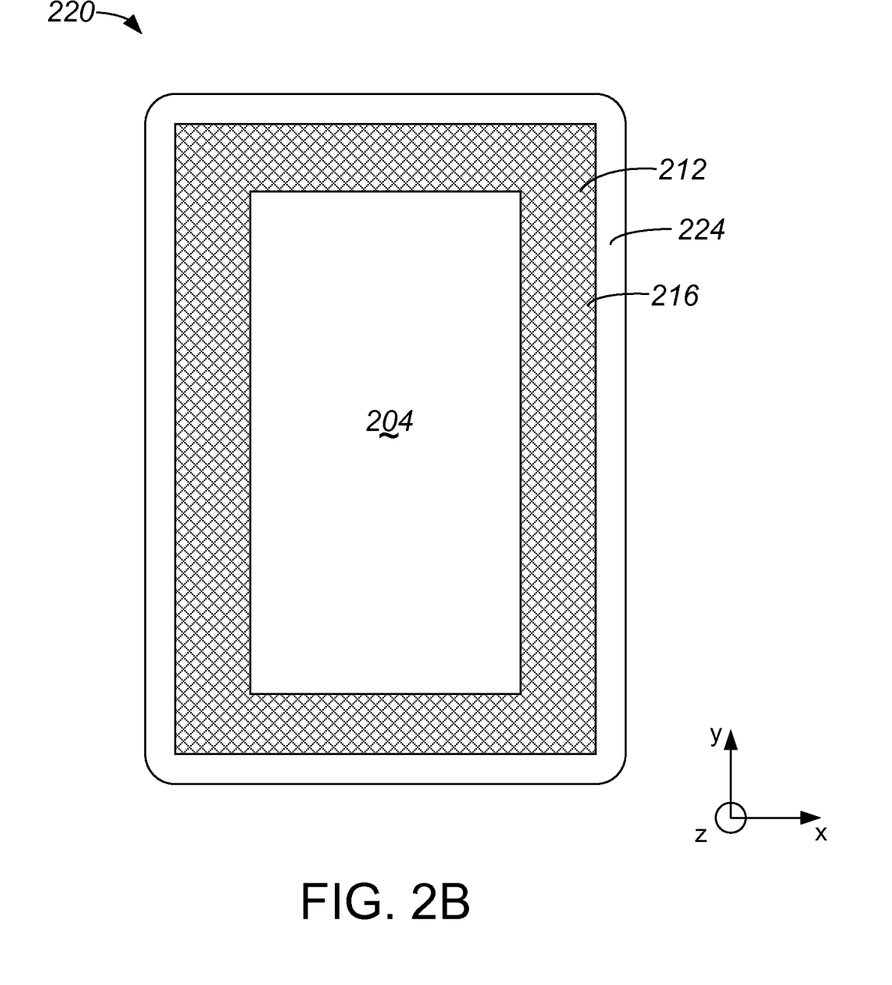
FIG. 2B is a diagrammatic top-view representation of a device, e.g., device 220 of FIG. 2A, in which substrate structure that includes an intermediate or buffer layer between a substrate and a PVD coating is incorporated in accordance with an embodiment.

FIG. 2A is a diagrammatic side-view cross-sectional representation of a device in which substrate structure that includes an intermediate or buffer layer between a substrate and a PVD coating is incorporated, and FIG. 2B is a diagrammatic top-view representation of the device in accordance with one embodiment. A device 220 includes a substrate 204 that is substantially coupled to a housing 224. Substrate 204 has a marking formed from a layer of PVD coating 216 that is deposited on an intermediate layer 212. Intermediate layer 212 is effectively bonded to a surface of substrate 204 which effectively helps to define an interior of device 220. As intermediate layer 212 is adhered to the surface of substrate 204 that faces the interior of device 220, both intermediate layer 212 and layer of PVD coating 216 are substantially inside device 220. However, in an alternative embodiment, intermediate layer and PVD coating can be provided on an outer surface of device 220.

As shown, the marking formed on substrate 204 by layer of PVD coating 216 is arranged substantially along the perimeter of substrate 204. In one implementation, substrate 204 and intermediate layer 212 are highly translucent (e.g., clear) such that when device 220 is viewed from the outside, PVD coating 216 appears as if it is directly on substrate 204. It should be appreciated, however, that the size, shape and position of the marking may vary widely. Further, the number of markings may also vary widely.

Figure 3:
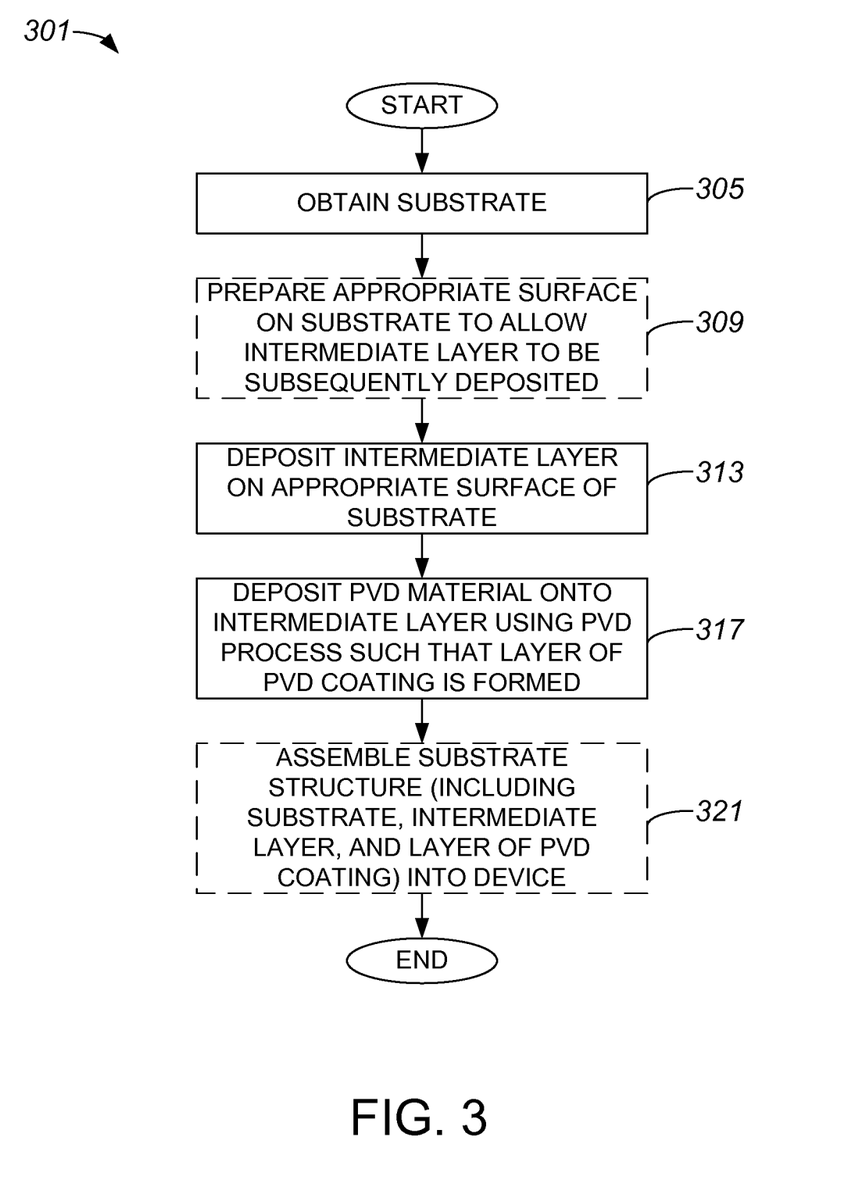
FIG. 3 is a process flow diagram which illustrates a method of forming a substrate structure that includes using a PVD process in accordance with one embodiment.

With reference to FIG. 3, a process of forming a substrate structure that will be described in accordance with one embodiment. A process 301 of forming a substrate structure includes obtaining a substrate in step 305. As previously mentioned, the substrate may be formed from any suitable material including, but not limited to including, glass, sapphire, metal, ceramic, and plastic. Once the substrate is obtained, the appropriate surface, e.g., the surface of the substrate onto which an intermediate layer is to be deposited, may be prepared in an optional step 309. Preparing the appropriate surface may include cleaning the surface and/or masking the surface. As will be appreciated by those skilled in the art, masking the surface may allow an intermediate layer to subsequently be deposited in appropriate locations on the surface of the substrate. In other words, masking the surface may facilitate identifying at least one location that is subsequently to be effectively marked using a PVD material.

In step 313, an intermediate layer is deposited on the appropriate surface of the substrate. The intermediate layer may be deposited using any suitable method. The intermediate layer may be formed from materials including, but not limited to including, $SiO_2$, $Si_3N_4$, $TiO_2$, fluorinated anti-smudge coatings, paint, clearcoat, adhesive, and ink. Depositing the intermediate layer may involve monitoring a thickness of the intermediate layer to ascertain when a desired thickness of the intermediate layer is reached.

From step 313, process flow proceeds to step 317 in which a PVD process is used to deposit PVD material onto the intermediate layer. Depositing the PVD material onto the intermediate layer allows a layer of PVD coating, or thin film, to be formed on the intermediate layer. The PVD material may be a metal such as chromium, aluminum, or silver. It should be appreciated, however, that the PVD material is not limited to being chromium, aluminum, or silver. The PVD process may include monitoring a thickness of a layer of PVD coating to determine when the layer of PVD coating reaches a desired thickness. It should be appreciated that if a mask is used to effectively control where an intermediate layer and a layer of PVD coating are formed, the mask may be removed when the layer of PVD coating reaches a desired thickness.

After the layer of PVD coating is deposited, a substrate structure which includes the substrate, the intermediate layer, and the layer of PVD coating is effectively formed, and the process of creating a substrate structure is effectively completed. As will be understood by those skilled in the art, however, creating a substrate structure may include optionally assembling the substrate structure into a device, e.g., a portable electronic device, in step 321.

Figure 4A:
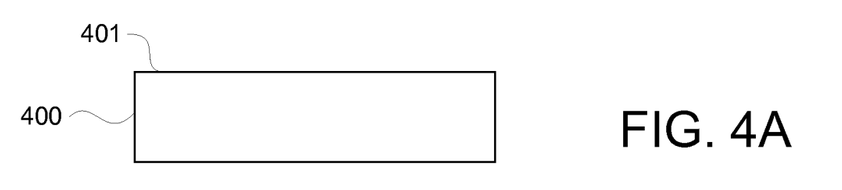
FIGS. 4A-4F are cross-sectional views illustrating formation of a substrate structure according to one embodiment.
Figure 4B:
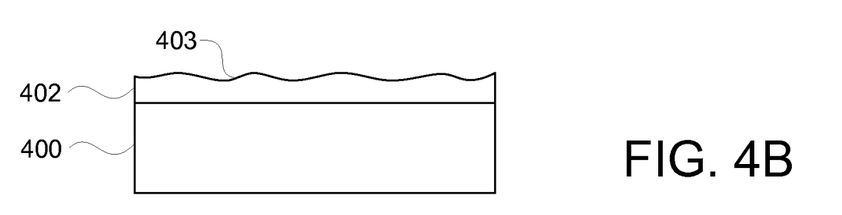

FIGS. 4A-4F are cross-sectional views illustrating formation of a substrate structure according to one embodiment. FIG. 4A illustrates a substrate 400 on which marking is to be eventually provided. As noted above, the substrate can be formed of various different materials. However, in one implementation, substrate 400 is formed of a translucent material such as glass or sapphire. FIG. 4B illustrates a buffering layer 402 provided on an exposed surface 401 of substrate 400. Buffering layer 402 is adhered to exposed surface 401 of substrate 400. As noted above, buffering layer 402 can be a material including, but not limited to including, $SiO_2$, $Si_3N_4$, $TiO_2$, fluorinated anti-smudge coatings, paint, clearcoat, adhesive, and ink. In the case of adhesive, suitable adhesives include a liquefiable optical adhesive, such as a Polyvinyl Acetate (PVA) adhesive. A liquefiable optical adhesive can provide excellent transparency as well as conformity to surface geometry. One particular example of a suitable adhesive is ThreeBond TB1630 adhesive from Three Bond Co., Ltd., Toyko, Japan. Buffering layer 402, once applied to substrate 400, may have a release liner and make further need to cure. Although not shown, if a release liner is present, the release liner would be removed. Regardless of whether buffering layer uses a release liner, an exposed surface 403 of buffering layer 402 tends to be irregular which tends to reduce quality of any marking subsequently placed on buffering layer 402.

Figure 4C:
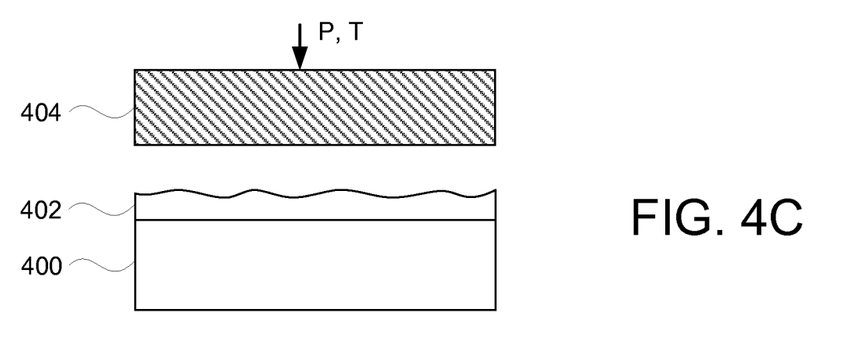
Figure 4D:
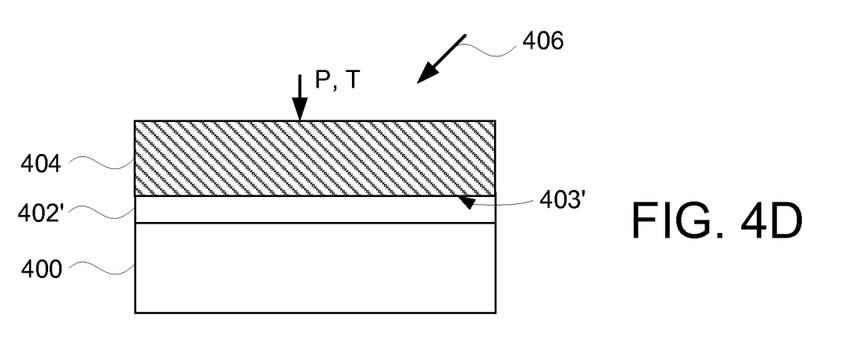
Figure 4E:
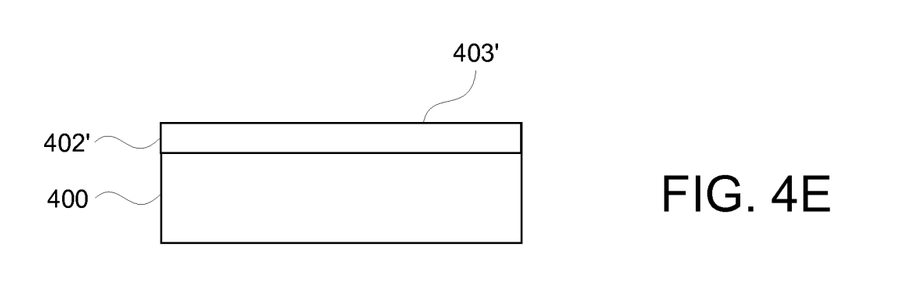

FIG. 4C illustrates a compression member 404 that is to be forced against buffering layer 402 provided on substrate 400. The compression member 404 is applied against buffering layer 402 using a force so that buffering layer 402 is placed under pressure (P). Heating is also provided to soften or liquefy buffer layer 402. The temperature (T) for the heating varies with the nature of the buffering layer 402. For example, the temperature (T) can be 80 degrees Celsius in one implementation. The heating can be provided by compression member 404 or by separate means. Compression member 404 is a planar surface and can be form of various materials. For example, compression member can be formed of glass or metal. The compression member 404 can be coated with material (e.g., non-stick coating, such as Teflon) to reduce its adhesion to buffering layer 402. FIG. 4D illustrates compression member 404 forced against buffering layer 402. Due to pressure and/or temperature imposed, buffering layer 402 conforms to a uniformly smooth exposed surface 403' resulting in a uniform buffering layer 402'. To induce or accelerate curing, ultraviolet (UV) light 406 can be directed towards buffering layer 402'. In one implementation, if compression member 404 is transparent, UV light 406 can be directed towards buffering layer 403 through compression member 404. FIG. 4E illustrates the substrate structure after compression member 404 has been removed. Buffering layer 402' now has exposed surface 403' that is uniformly smooth.

Figure 4F:
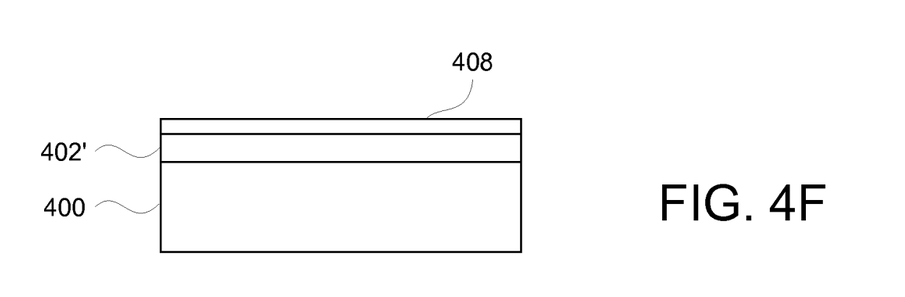

FIG. 4F illustrates a marking layer 408 provided on buffering layer 402'. Marking layer 408 can be provided on buffering layer 402' by a PVD process. Depositing PVD material onto buffering layer 402' allows a layer of PVD coating, or thin film, to be formed on buffering layer 402'. The PVD material may be a metal such as chromium, aluminum, or silver. The markings may be textual and/or graphic. The markings may be used to provide a product (e.g., a product's housing) with certain information. The marking may, for example, be use to label the product with various information. Although cross-sectional view in FIG. 4F illustrates the marking layer 408 extending across the buffering layer 402', the marking layer 408 need not extend over the entirety of the buffering layer 402'.

Figure 5:
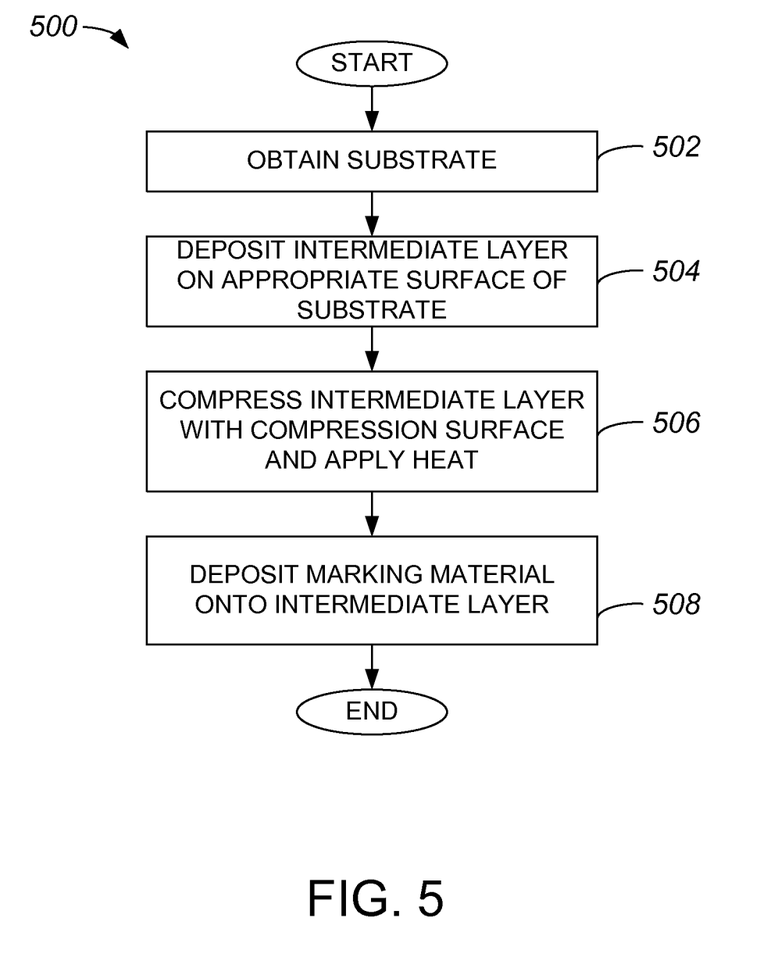
FIG. 5 is a flow diagram of a marking process according to one embodiment.

FIG. 5 is a flow diagram of a marking process 500 according to one embodiment. The marking process 500 operates to mark (or label) an electronic device, such as a portable electronic device. The marking can be precise, high resolution and uniform. The marking process 500 can initially obtain a substrate at step 502. An intermediate layer can then be deposited on an appropriate surface of the substrate in step 504. The substrate can pertain to a portion of a housing for an electronic device or can pertain to a structure that is otherwise an outer surface for the electronic device. As one example, the substrate can pertain to a touch screen surface, such as a touch screen surface formed of glass. The intermediate layer can be adhered to appropriate surface of the substrate. For example, the intermediate layer can be bonded to the appropriate surface of the substrate. Next, at step 506, the intermediate layer can be compressed towards the appropriate surface of the substrate to render the exposed surface of the intermediate layer uniform and flat. The intermediate layer may also be heated. The intermediate layer under press and heated can soften or liquefy so as to conform to surface geometry and provide a flat exposed surface. Thereafter, the exposed surface of the intermediate layer can have marking material deposited thereon. In one embodiment, the marking material involves deposition of a PVD material using a PVD process. The deposited marking material serves to mark (or label) the substrate of an electronic device.

Figure 6:
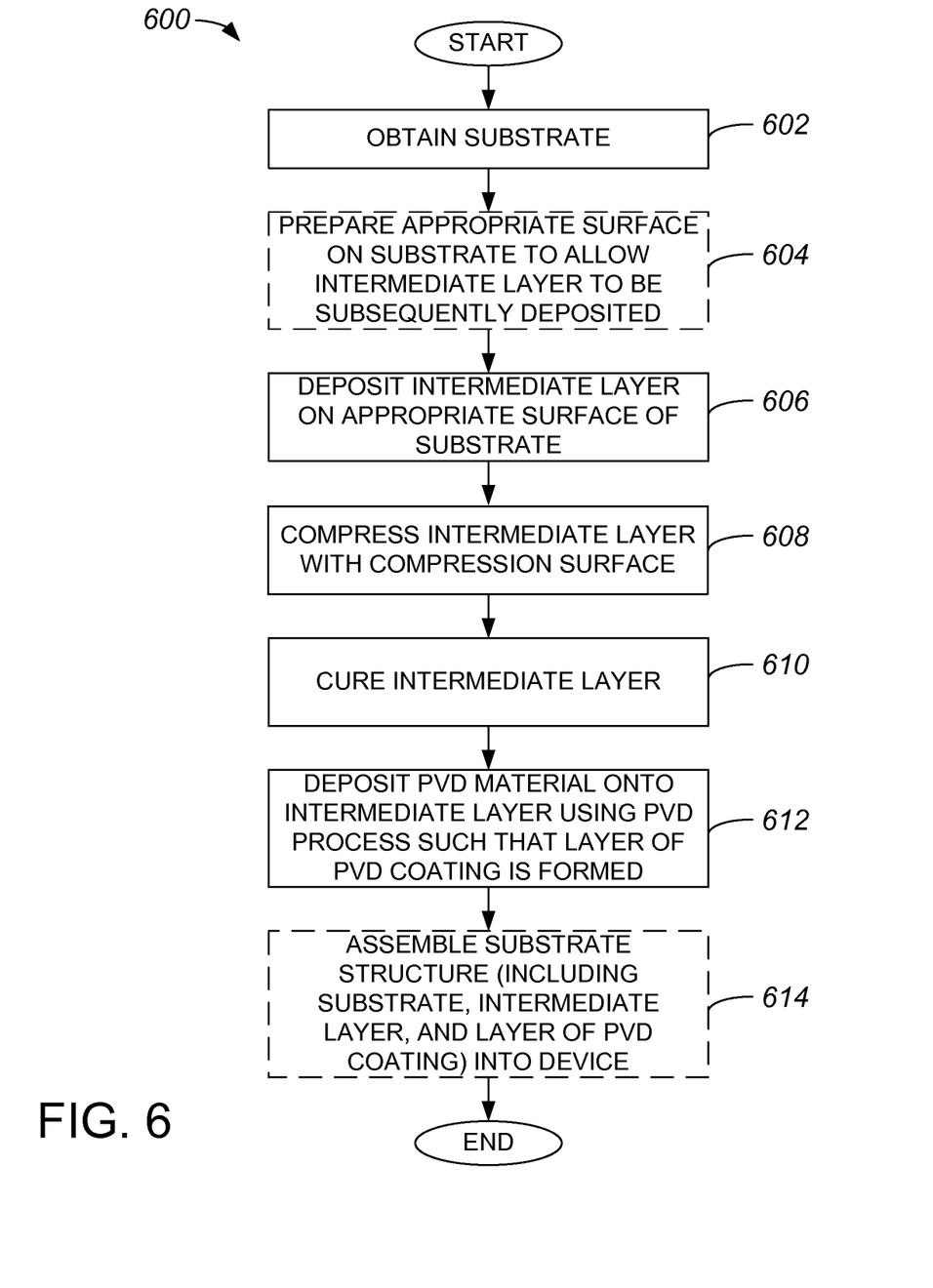
FIG. 6 is a process flow diagram which illustrates a method of forming a substrate structure that includes using a PVD process in accordance with another embodiment.

With reference to FIG. 6, a process of forming a substrate structure that will be described in accordance with one embodiment. A process 600 of forming a substrate structure includes obtaining a substrate in step 602. As previously mentioned, the substrate may be formed from any suitable material including, but not limited to including, glass, sapphire, metal, ceramic, and plastic. Once the substrate is obtained, the appropriate surface, e.g., the surface of the substrate onto which an intermediate layer is to be deposited, may be prepared in an optional step 604. Preparing the appropriate surface may include cleaning the surface and/or masking the surface. As will be appreciated by those skilled in the art, masking the surface may allow an intermediate layer to subsequently be deposited in appropriate locations on the surface of the substrate. In other words, masking the surface may facilitate identifying at least one location that is subsequently to be effectively marked using a PVD material.

In step 606, an intermediate layer is deposited on the appropriate surface of the substrate. The intermediate layer may be deposited using any suitable method. The intermediate layer may be formed from materials including, but not limited to including, $SiO_2$, $Si_3N_4$, $TiO_2$, fluorinated anti-smudge coatings, paint, clearcoat, adhesive, and ink. Depositing the intermediate layer may involve monitoring a thickness of the intermediate layer to ascertain when a desired thickness of the intermediate layer is reached.

In step 608, the intermediate layer is compressed using a compression surface. For example, the intermediate layer can be an adhesive that under pressure and elevated temperature softens or liquefies so as to conform to and bond with the substrate and also to provide a smooth, uniform, flat exposed surface. The intermediate layer, e.g., adhesive, can then be cured at step 610. For example, UV light can be directed towards the intermediate layer to accelerate or activate curing.

From step 610, process flow proceeds to step 612 in which a PVD process is used to deposit PVD material onto appropriate portions the intermediate layer. Depositing the PVD material onto the intermediate layer allows a layer of PVD coating, or thin film, to be formed on the intermediate layer. The PVD material may be a metal such as chromium, aluminum, or silver. It should be appreciated, however, that the PVD material is not limited to being chromium, aluminum, or silver. The PVD process may include monitoring a thickness of a layer of PVD coating to determine when the layer of PVD coating reaches a desired thickness. It should be appreciated that if a mask is used to effectively control where an intermediate layer and a layer of PVD coating are formed, the mask may be removed when the layer of PVD coating reaches a desired thickness.

After the layer of PVD coating is deposited, a substrate structure which includes the substrate, the intermediate layer, and the layer of PVD coating is effectively formed, and the process of creating a substrate structure is effectively completed. As will be understood by those skilled in the art, however, creating a substrate structure may include optionally assembling the substrate structure into a device, e.g., a portable electronic device, in step 614.

Although only a few embodiments of the invention have been described, it should be understood that the invention may be embodied in many other specific forms without departing from the spirit or the scope of the present invention. By way of example, while an intermediate layer and a layer of PVD coating have been described as being deposited on a side of a substrate that is to be substantially inside of a device, it should be appreciated that an intermediate layer and a layer PVD coating may instead be deposited on a side of the substrate that is to be substantially outside of the device.

The use of an intermediate layer as a buffer between a substrate and a layer of PVD coating is particularly suitable for reducing the occurrence of premature fractures in brittle substrates, e.g., substrates which are formed from glass.

However, an intermediate layer in a substrate structure may be used to reduce stresses on any suitable substrate, including those which are not substantially brittle.

In general, an intermediate layer may include discrete portions configured to correspond to a marking that is to be formed by a PVD coating. That is, an intermediate layer may have substantially the same footprint as a marking that is formed by the PVD coating. The intermediate layer, however, is not limited to having substantially the same footprint as a marking. For instance, the intermediate layer may instead be arranged to cover substantially all of a surface of a substrate, while the marking covers only certain portions of the intermediate layer and, hence, the substrate. In other words, an intermediate layer may be substantially continuous, rather than discrete. Portions of the intermediate layer which are not overlaid by a PVD coating may, in some instances, be arranged to enhance the overall cosmetic appearance of the substrate.

As mentioned above, an intermediate layer may include a plurality of sub-layers. In other words, an intermediate layer may be formed from sub-layers of different materials, and is not limited to being formed as a substantially single layer using a single material.

The thicknesses of an intermediate layer and a layer of PVD coating may vary widely depending upon factors which may include, but are not limited to including, the thickness of a substrate, the size of a marking to be provided on the substrate, and the materials used to form the intermediate layer and/or the layer PVD coating.

U.S. Provisional Patent Application No. 61/236,847, filed Aug. 25, 2009 and entitled "Method and Apparatus for Applying a Physical Vapor Deposition Material on a Substrate" is hereby incorporated herein by reference.

Numerous specific details are set forth in order to provide a thorough understanding of the invention. However, it will become obvious to those skilled in the art that the invention may be practiced without these specific details. The description and representation herein are the common meanings used by those experienced or skilled in the art to most effectively convey the substance of their work to others skilled in the art. In other instances, well-known methods, procedures, components, and circuitry have not been described in detail to avoid unnecessarily obscuring aspects of the invention.

In the foregoing description, reference to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

The many features and advantages of the invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An electronic device comprising:
   a glass housing layer having opposing exterior and interior surfaces;
   a buffer layer on the interior surface of the glass housing layer that includes silicon dioxide; and
   a physical vapor deposition layer deposited on the buffer layer.

2. The electronic device defined in claim 1 wherein the physical vapor deposition layer is viewable through the exterior surface of the glass housing.

3. The electronic device defined in claim 2 wherein the physical vapor deposition layer forms a logo.

4. The electronic device defined in claim 2 wherein the physical vapor deposition layer forms text.

5. The electronic device defined in claim 1 wherein the buffer layer has a thickness between 50 nm and 500 nm.

6. The electronic device defined in claim 1 wherein the buffer layer isolates the interior surface of the glass housing layer from the physical vapor deposition layer.

7. The electronic device defined in claim 1 further comprising a layer of ink formed over the silicon dioxide of the buffer layer.

8. The electronic device defined in claim 1 wherein the buffer layer is transparent.

9. The electronic device defined in claim 1 further comprising:
   an additional housing layer; and
   sidewalls extending between the glass housing layer and the additional housing layer, wherein the buffer layer and the physical vapor deposition layer are interposed between the glass housing layer, the additional housing layer, and the sidewalls.

10. The electronic device defined in claim 1 wherein the buffer layer includes polyvinyl acetate.

11. An electronic device comprising:
    a glass housing layer having opposing interior and exterior surfaces;
    a buffer layer on the interior surface of the glass housing; and
    a physical vapor deposition coating deposited on the buffer layer, wherein the physical vapor deposition layer is viewable through the exterior surface of the glass housing and the buffer layer.

12. The electronic device defined in claim 11 wherein the buffer layer includes silicon dioxide.

13. The electronic device defined in claim 11 wherein the buffer layer comprises polyvinyl acetate.

14. The electronic device defined in claim 11 further comprising:
    a housing having an interior and an exterior, wherein the glass housing layer is mounted in the housing with the buffer layer and the physical vapor deposition layer in the interior of the housing.

15. The electronic device defined in claim 14 wherein the buffer layer has a first thickness, the physical vapor deposition has a second thickness, and the first thickness is greater than the first thickness.

16. An electronic device comprising:
    a glass housing layer having opposing interior and exterior surfaces;
    a buffer layer on the interior surface of the glass housing layer, wherein the buffer layer comprises silicon dioxide; and
    a physical vapor deposition coating deposited on the buffer layer, wherein the physical vapor deposition layer comprises reflective structures.

17. The electronic device defined in claim 16 wherein the physical vapor deposition coating is viewable through the exterior surface of the glass housing.

18. The electronic device defined in claim 17 wherein the buffer layer has a thickness between 50 nm and 500 nm.

19. The electronic device defined in claim 18 wherein the physical vapor coating has a thickness between 25 nm and 250 nm.

20. The electronic device defined in claim 17 wherein the buffer layer has a thickness between 1 micron and 10 microns.

* * * * *